United States Patent [19]

Hyakutake

[11] Patent Number: 5,105,273

[45] Date of Patent: Apr. 14, 1992

[54] VIDEO INTERMEDIATE FREQUENCY SIGNAL PROCESSING CIRCUIT

[75] Inventor: Junichi Hyakutake, Itami, Japan

[73] Assignee: Mitsubishi Denki Kabushiki Kaisha, Tokyo, Japan

[21] Appl. No.: 496,529

[22] Filed: Mar. 20, 1990

[30] Foreign Application Priority Data

Jul. 12, 1989 [JP] Japan .................................. 1-181022

[51] Int. Cl.$^5$ ............................................. H04N 5/14
[52] U.S. Cl. ...................................... 358/160; 358/188
[58] Field of Search ............... 358/160, 188, 158, 174, 358/176

[56] References Cited

U.S. PATENT DOCUMENTS 4,811,096 3/1989 Gakumura ........................... 358/160

OTHER PUBLICATIONS

P. Fockens, C. G. Eilers; Intercarrier Buzz Phenomena Analysis and Cures, IEEE Transactions on Consumer Electronics, vol. CE-27, No. 3, Aug. 1981, pp. 381-397.
A. Hamada, Phase-Lock Television IF Amplifier-Video Detector, IEEE Transactions on Consumer Electronics, vol. CE-21, No. 4, Nov. 1975, pp. 340-347.
M. Huber, H. Kriedt, R. Stepp, Modular Video IF Concept, IEEE Transactions on Consumer Electronics, vol. CE-29, No. 3, Aug. 1983, pp. 414-419.

Primary Examiner—James J. Groody
Assistant Examiner—Minsun Oh
Attorney, Agent, or Firm—Oblon, Spivak, McClelland, Maier & Neustadt

[57] ABSTRACT

A video intermediate frequency signal processing circuit according to the present invention is so structured that a PLL state and a holding state are switched in response to a locking detection signal, a signal strength detection signal and a modulation factor detection signal. Thus, when it is set to enter the holding state at timing when the modulation factor of the video intermediate frequency signal is deep on the basis of the modulation factor detection signal, PLL output will not follow a video intermediate frequency signal at timing when the modulation factor is deep but follows only a video intermediate frequency signal at timing when the modulation factor is shallow, whereby correct video detection output can be regularly derived.

Further, the PLL state can be regularly attained regardless of the modulation factor of the video intermediate frequency signal in unlocking or in input of a weak electric field, on the basis of the locking detection signal and the signal strength detection signal, whereby responsibility similar to that in the prior art can also be secured.

10 Claims, 9 Drawing Sheets

VIDEO INTERMEDIATE FREQUENCY SIGNAL PROCESSING CIRCUIT

BACKGROUND OF THE INVENTION

1. Field of the Invention

The present invention relates to a circuit for processing a video intermediate frequency signal, and more particularly, it relates to a video detection circuit for demodulating a video signal from a video intermediate frequency signal.

2. Description of the Prior Art

FIG. 1 is a block diagram showing circuit structure of a conventional intercarrier system television receiver. A broadcasting signal received by an antenna 11 is converted by a tuner 13 to a video intermediate frequency (hereinafter referred to as VIF) signal having a video carrier frequency $f_p$ (58.75 MHz in Japan). The VIF signal includes a sound intermediate frequency signal having a sound carrier frequency $f_{s1}$ (54.25 MHz in Japan). This VIF signal is amplified by an intermediate frequency amplifier 15, and supplied to a video detection circuit 17. The video detection circuit 17 detects the VIF signal, and outputs a video detection output signal. This video detection output signal includes a sound intermediate frequency signal component having a sound carrier frequency $f_{s2}$ (4.5 MHz in Japan) in addition to a demodulated video signal component. The sound intermediate frequency signal is eliminated by a sound trap circuit 19, so that only the demodulated video signal is processed in a video circuit 21 and supplied to a picture tube 23. On the other hand, only the sound intermediate frequency signal is extracted by a sound filter 25, demodulated by a frequency demodulation circuit 27 to a sound signal, then amplified by a sound amplifier 29, and supplied to a speaker 31.

FIG. 2 is a block diagram showing conventional circuit structure of the video detection circuit 17. The VIF signal from the intermediate frequency amplifier 15 is inputted in a bandpass filter 33, which is formed by a surface acoustic wave filter, for example. The bandpass filter 33 has such bandpass characteristics that the amount of passage of the frequency $f_p$ is $-6$ dB and having linear inclination within a range of the frequency $f_p \pm 0.7$ MHz, as shown in FIG. 3. It is well known that correct video detection output can be obtained by the bandpass filter 33 having such bandpass characteristics, as described in "Circuit Design of a Television Receiver", literature issued in 1968 by Radio Gijutsusha, pp. 125-127, for example.

The VIF signal filtered by the bandpass filter 33 is taken in an amplifier 1 and amplified. The amplifier 1 is controlled by an automatic gain control (hereinafter referred to as AGC) circuit 2 to regularly maintain its output in an optimum constant amplitude regardless of amplitude variation in the VIF signal.

Output from the amplifier 1 is supplied to a phase locked loop (hereinafter referred to as PLL) circuit 3 and a synchronous detection circuit 4. The PLL circuit 3 is formed by a voltage controlled oscillator (hereinafter referred to as VCO) 6, a phase shifter 7 for making the phase of output S6 from the VCO 6 lead by 90°, a phase detection circuit 8 for phase-comparing output S7 of the phase shifter 7 with output S1 of the amplifier 1, and a lowpass filter (hereinafter referred to as LPF) 9 for filtering output S8 of the phase detection circuit 8 and supplying the same to control input of the VCO 6. When the PLL circuit 3 is locked, the output S6 of the VCO 6 is equalized in frequency and phase to the normal video carrier (frequency: $f_p$) of the VIF signal, and supplied to the synchronous detection circuit 4. The synchronous detection circuit 4 synchronously detects the output S1 of the amplifier 1 on the basis of this signal, to derive video detection output S4.

This video detection output S4 is outputted to the exterior, as well as fed back to the AGC circuit 2 and a locking detection circuit 10 which are provided in the interior. The AGC circuit 2 detects the amplitude of the video detection output S4, to control the amplification factor of the amplifier 1 so that this amplitude is regularly at a constant level. On the other hand, the locking detection circuit 10 detects whether or not the PLL circuit 3 is locked or unlocked on the basis of the video detection ouyput S4, to control the time constant of the LPF 9. That is, it reduces the time constant of the LPF 9 in unlocking to speed up the response, thereby to widen a capture range of the PLL circuit 3. In locking, on the other hand, it increases the time constant of the LPF 9 to slow down the response, thereby to hardly respond to noise, phase distortion originally provided in the VIF signal or the like. Further correct video detection output S4 can be obtained by utilizing output S10 of such locking detection circuit 10.

FIG. 4 is a circuit diagram showing exemplary structure of the phase detection circuit 8 and the LPF 9. As shown in the figure, a signal S1 obtained by amplifying the VIF signal by the amplifier 1 is inputted in bases of npn transistors Q1 and Q2 of the phase detection circuit 8, while a signal S7 obtained by phase-shifting the oscillation output signal S6 of the VCO 6 by 90° through the phase shifter 7 is inputted in bases of npn transistors Q3 to Q6. The collector of the transistor Q1 is commonly connected with emitters of the transistors Q3 and Q4, while the collector of the transistor Q2 is commonly connected with emitters of the transistors Q5 and Q6 respectively. A constant current source I1 is commonly connected between the emitters of the transistors Q1 and Q2 and the ground level. A double balanced type modulator is formed by the aforementioned transistors Q1 to Q6.

The collectors of the transistors Q3 and Q5 are connected to the collector of a common base/collector pnp transistor Q7, as well as to the base of a pnp transistor Q9. The collectors of the transistors Q4 and Q6 are connected to the collector of a common base/collector pnp transistor Q8. The base of a pnp transistor Q10 is connected to the base of the transistor Q8. All of emitters of the aforementioned transistors Q7 to Q10 are connected to a power supply line IV. The collector of the transistor Q9 is connected to the collector of an npn transistor Q11, while the collector of the transistor Q10 is connected to the collector of a common base/collector npn transistor Q12. The bases of the transistors Q11 and Q12 are connected with each other, while respective emitters thereof are grounded.

In the phase detection circuit 8 having the aforementioned structure, the result of multiplication of the signals S1 and S7 obtained by the double balanced type modulator which is formed by the transistors Q1 to Q6 is outputted as current signals from the collectors of the transistors Q9 and Q10. Difference in these current signals forms the phase detection output S4.

On the other hand, the LPF 9 is formed by resistors R1 to R5, npn transistors Q13 and Q14, a capacitor C1 and a constant current source I2. A bias circuit formed by the resistors R1 and R2, the transistor Q13 and the constant current source I2 defines central voltage of a node N1 by supplying bias voltage from the emitter of the transistor Q13. The voltage value of the node N1 is determined around the bias voltage by charging of the capacitor C1 following the phase detection output S8 and discharging of the capacitor C1 through the resistor R3. The voltage value of the node N1 is supplied to the VCO 6 as the output S9 of the LPF 9.

The time constant of the LPF 9 is determined by the resistors R3 and R4, the capacitor C1 and ON state resistance of the transistor Q14 when the transistor Q14 is ON, while being determined by the resistors R3 to R5 and the capacitor C1 when the transistor Q14 is OFF. The base of the transistor Q14 is connected to the collector of an npn transistor Q15. This npn transistor Q15 has a collector which is connected to the power supply line IV through the resistor R6, a grounded emitter and a base which is supplied with the output S10 ("L" in detection of locking and "H" in detection of unlocking) of the locking detection circuit 10.

Thus, the time constant of the LPF 9 is increased when the PLL circuit 3 is locked since the transistor Q15 is turned off and the transistor Q14 is turned on, while the time constant of the LPF 9 is reduced when the PLL circuit 3 is unlocked since the transistor Q15 is turned on and the transistor Q14 is turned off.

The conventional video intermediate frequency signal processing circuit of the aforementioned structure has the following three problems:

(1) When the broadcasting signal is overmodulated (when the deepest modulation factor in the broadcasting signal reaches about 100%, for example), the phase detection output S8 at timing of a deep modulation factor includes a large number of error components and the VCO 6 is inevitably controlled by the phase detection output S8 including such error components. Consequently, the VCO 6 cannot output normal oscillation output signal S6, and hence correct video detection output S4 cannot be obtained from the synchronous detection circuit 4.

(2) Even if the modulation factor of the broadcasting signal is within the range of the generally allowable maximum modulation factor, the phase of the video carrier may be varied with difference in modulation factor in the broadcasting signal due to nonlinearity of the amplification characteristic of a high power amplifier since the broadcasting signal is transmitted from a transmitter through the high power amplifier. When such a broadcasting signal is received by the antenna 11 and taken in the video detection circuit 17 through the tuner 13 and the intermediate frequency amplifier 15, the VCO 6 in the PLL circuit 3 correctly follows phase variation of the video carrier to oscillate. Since the synchronous detection circuit 4 synchronously detects the VIF signal on the basis of the oscillation output signal S6 of the VCO 6, a phasemodulated component is mixed into the sound intermediate frequency signal included in the video detection output S4. This phasemodulated component appears as a sound buzz when the sound intermediate frequency signal is FM-detected.

(3) In the system of simultaneously extracting the video signal and the sound intermediate frequency signal from the video detection output as in the television receiver shown in FIG. 1, the VIF signal is necessarily filtered by the bandpass filter 33 having inclination around the frequency $f_p$ as shown in FIG. 3, for frequency selection. Therefore, the video carrier signal is phase-modulated by an AM component of the VIF signal, as described in Japanese Patent Publication Gazette No. 61-11030 or in the aforementioned literature. The output of the VCO 6 in the PLL circuit 3 correctly follows the same, and a phase-modulated component is mixed into the sound intermediate frequency signal included in the video detection output S4 since the synchronous detection circuit 4 synchronously detects the VIF signal on the basis of the output S6 of the VCO 6. Consequently, a sound buzz is caused when the sound intermediate frequency signal is FM-modulated, similarly to the above item (2).

SUMMARY OF THE INVENTION

A video intermediate frequency signal circuit according to the present invention comprises input means for inputting a video intermediate frequency signal, a PLL circuit connected to the input means and including a phase detection circuit, a low-pass filter and a voltage controlled oscillator to form a phase lock loop (PLL), for outputting a PLL output signal being synchronous with the video intermediate frequency signal in locking, a synchronous detection circuit connected to the input means and the PLL circuit for synchronously detecting the video intermediate frequency signal on the basis of the PLL output signal to derive video detection output, PLL locking detection means connected to the synchronous detection circuit for detecting locked and unlocked states of the PLL circuit on the basis of the video detection output to output a locking detection signal indicating whether the PLL circuit is in the locked state or the unlocked state, signal strength detection means connected to the synchronous detection circuit for detecting signal strength of the video intermediate frequency signal on the basis of the video detection output to output a signal strength detection signal indicating whether or not the video intermediate frequency signal corresponds to a weak electric field, and modulation factor detection means connected to the synchronous detection circuit for detecting a modulation factor of every moment of the video intermediate frequency signal to output a modulation factor detection signal indicating whether or not the modulation factor of the video intermediate frequency signal is less than a prescribed value, the PLL circuit receiving the locking detection signal, the signal strength detection signal and the modulation factor detection signal to be switched between a PLL state and a holding state in response to these signals for deriving from the phase detection circuit a signal responsive to phase difference between the video intermediate frequency signal and an oscillation output signal from the voltage controlled oscillator to supply the same to the voltage controlled oscillator through the low-pass filter to thereby output the PLL output signal in the PLL state while maintaining the oscillation output signal of the voltage controlled oscillator in the PLL state immediately before the holding state to thereby output the PLL output signal in the holding state.

According to the present invention, a PLL circuit is switched between a PLL state and a holding state in response to a locking detection signal, a signal strength detection signal and a modulation factor detection signal, so that PLL output will not follow a video intermediate frequency signal at timing of a deep modulation factor but follows only a video intermediate frequency signal at timing of a shallow modulation factor when the PLL circuit is so set that the same enters the holding state at the timing of a deep modulation factor of the video intermediate frequency signal on the basis of the modulation factor detection signal.

Accordingly, an object of the present invention is to obtain a video intermediate frequency signal processing circuit which can solve the aforementioned problems (1) to (3) to regularly obtain correct video detection output.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
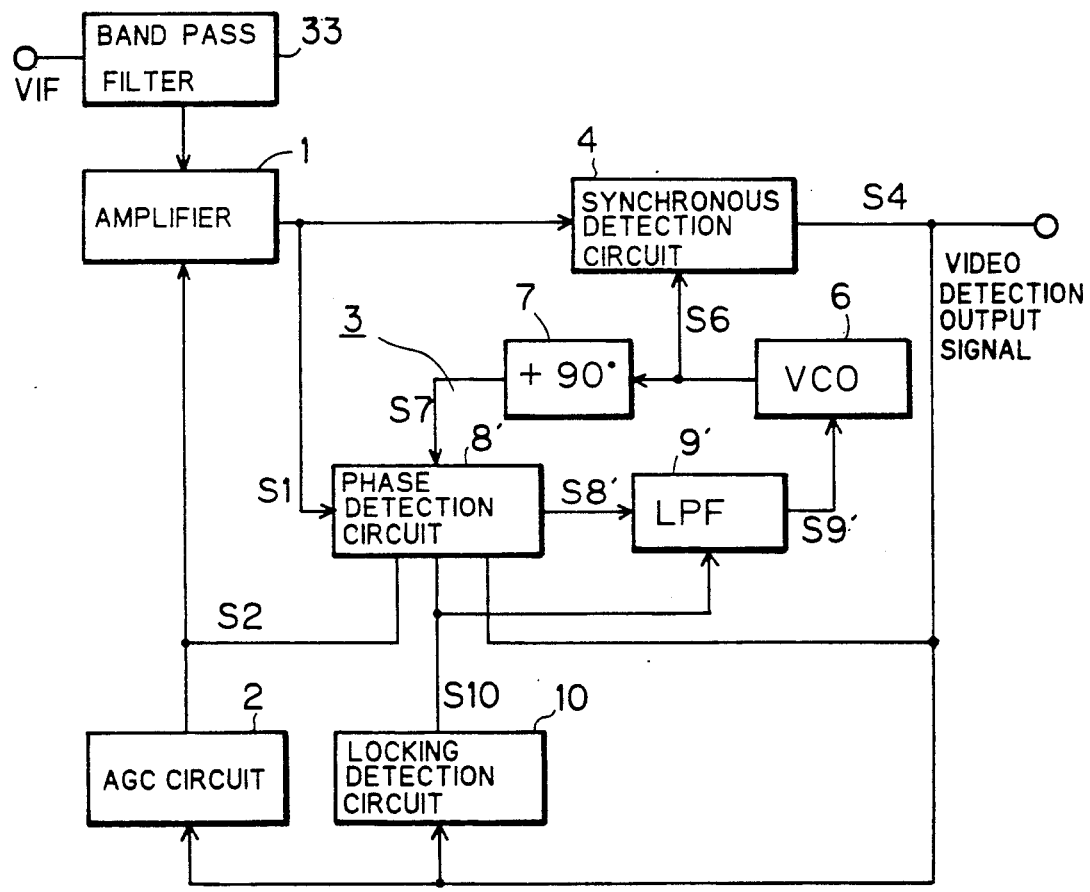
FIG. 5 is a block diagram showing a video detection circuit according to an embodiment of the present invention.

FIG. 5 is a block diagram showing circuit structure of a video detection circuit according to an embodiment of the present invention. As shown in the figure, a phase detection circuit 8' receives video detection output S4, output S10 of a locking detection circuit 10 and AGC output S2 of an AGC circuit 2, in addition to output of an amplifier 1.

The operating mode of the phase detection circuit 8' is switched on the basis of the aforementioned three outputs S2, S4 and S10, as hereinafter described in detail. In response to this, a PLL circuit 3 is switched between a PLL state and a holding state. In the PLL state, the phase detection circuit 8' phase-compares the output S1 of the amplifier 1 with output S7 of a phase shifter 7, to output phase detection output S8'. In the holding state, the phase detection circuit 8' holds and outputs the phase detection output S8' outputted in the last PLL state. The phase detection circuit 8' utilizes a capacitor provided in an LPF 9', as hereinafter described.

Figure 1:
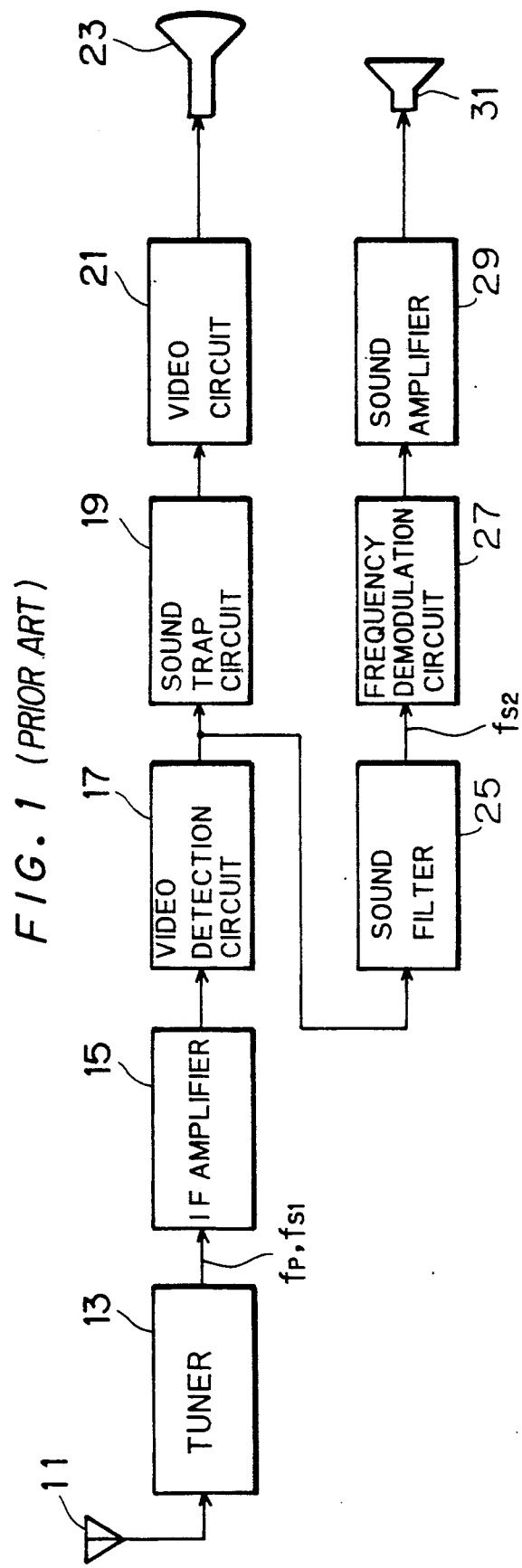
FIG. 1 is a block diagram showing a conventional television receiver.
Figure 2:
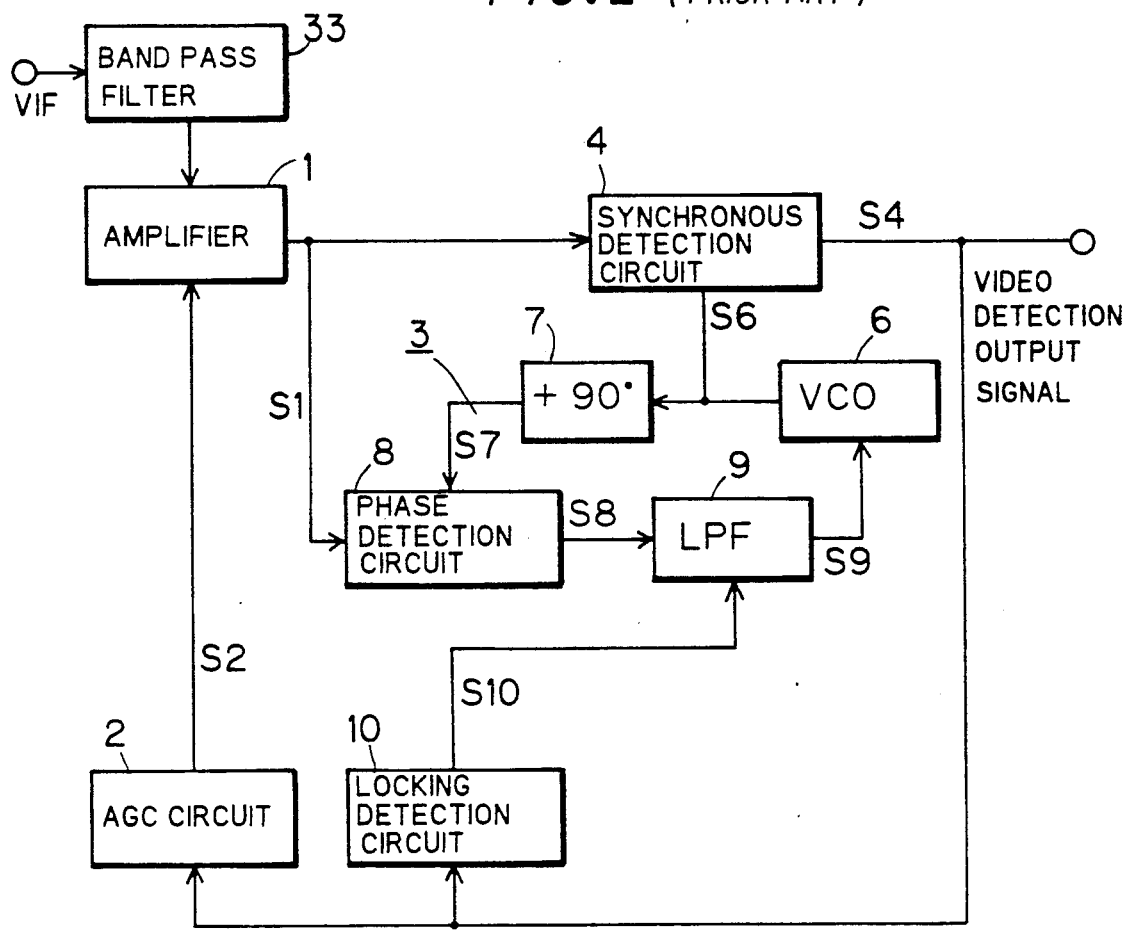
FIG. 2 is a block diagram showing a conventional video detection circuit.
Figure 3:
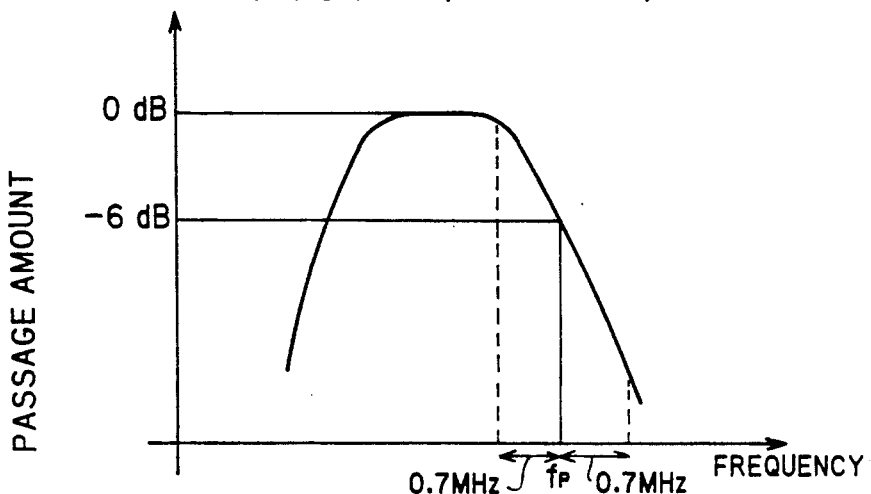
FIG. 3 illustrates bandpass characteristics of a bandpass filter in the conventional video detection circuit.

Other structure of this embodiment is similar to that of the conventional circuit shown in FIG. 2, and hence redundant description is omitted.

Figure 4:
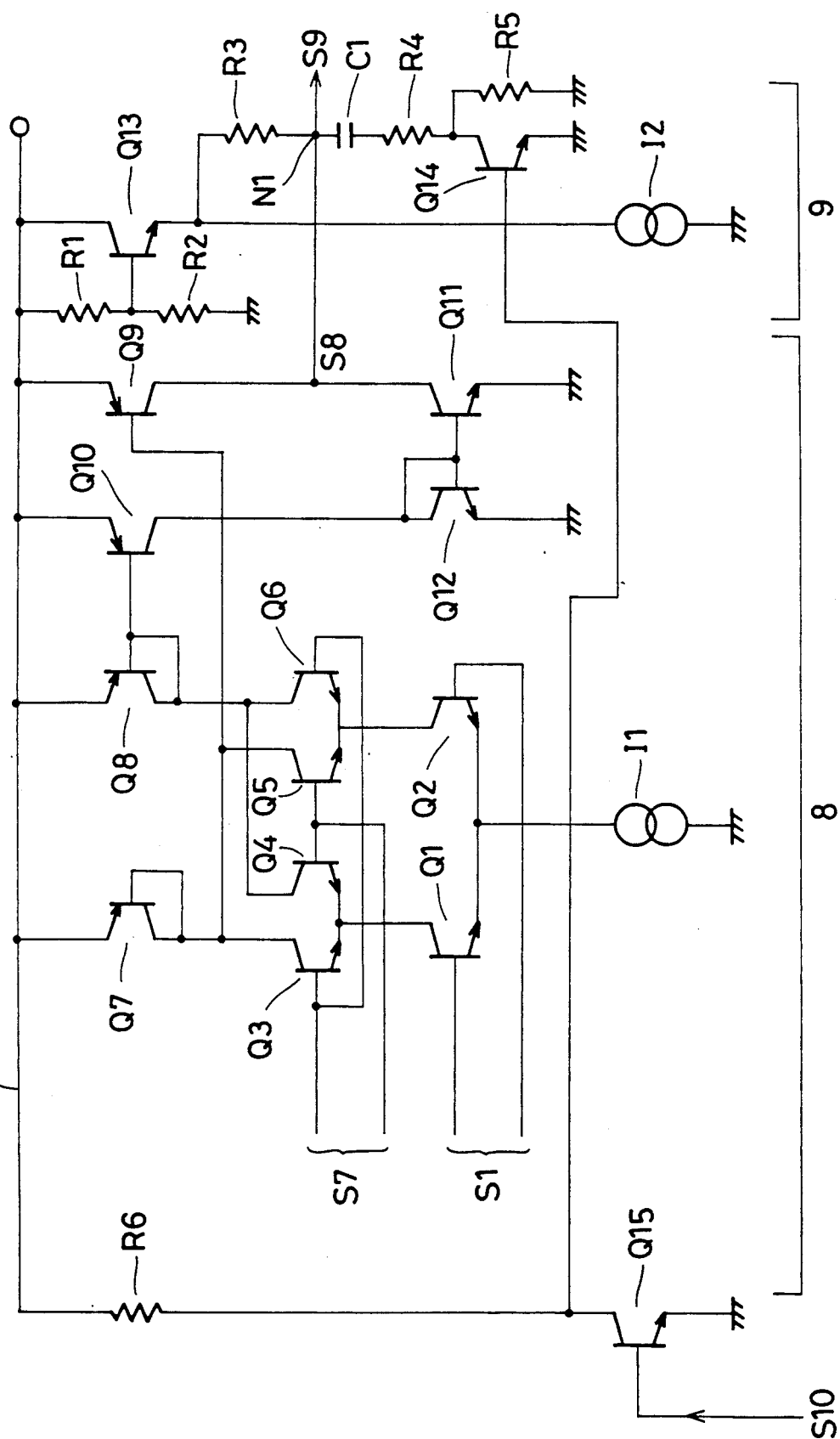
FIG. 4 illustrates exemplary structure of a phase detection circuit and an LPF shown in FIG. 2.
Figure 6A:
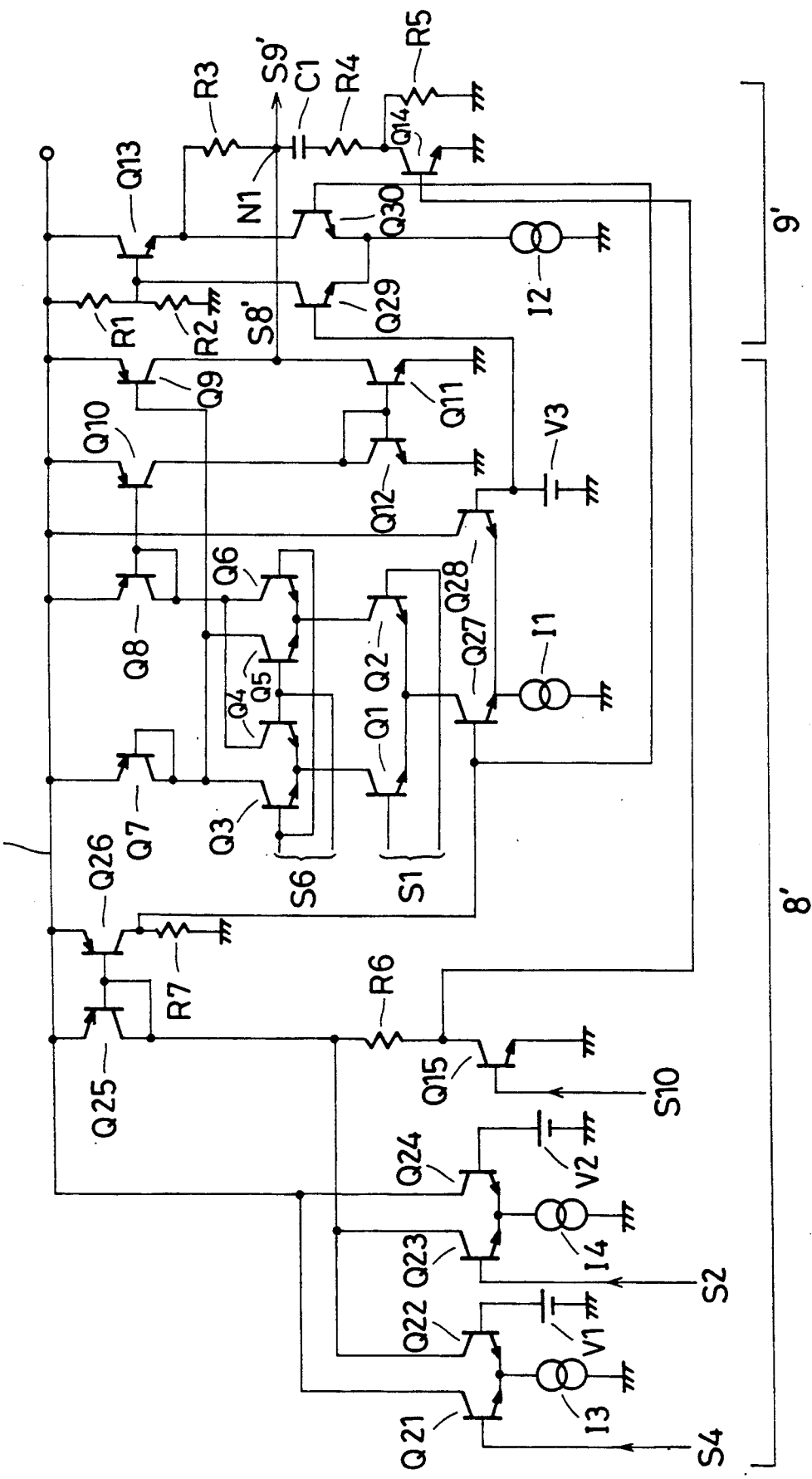
FIGS. 6A and 6B are circuit diagrams showing exemplary structure around a phase detection circuit and an LPF shown in FIG. 5.

FIG. 6A is a circuit diagram showing exemplary structure of the phase detection circuit 8' and the LPF 9'. Referring to the figure, a circuit part formed by transistors Q1 to Q15, resistors R1 to R6, a capacitor C1 and constant current sources I1 and I2 is similar to the conventional circuit shown in FIG. 4, and hence redundant description is omitted.

As shown in the figure, the video detection output S4 and the AGC output S2 are inputted in bases of npn transistors Q21 and Q23 respectively. The voltage value of the AGC output S2 reaches the maximum value (>reference voltage V2) since the amplitude of the video detection output S4 is small when a weak electric field is inputted, and the gain of the amplifier 1 is maximized at this time. The transistor Q21 is differentially paired with an npn transistor Q22 which receives reference voltage V1 in its base, and emitters of these transistors Q21 and Q22 are grounded through a constant current source I3. The transistor Q23 is differentially paired with an npn transistor Q24 which receives the reference voltage V2 in its base, and emitters of these transistors Q23 and Q24 are grounded through another constant current source I4. Both of the collectors of the transistors Q21 and Q24 are connected to a power supply line IV, while both of the collectors of the transistors Q22 and Q23 are connected to the collector of a pnp transistor Q25.

Figure 7A:
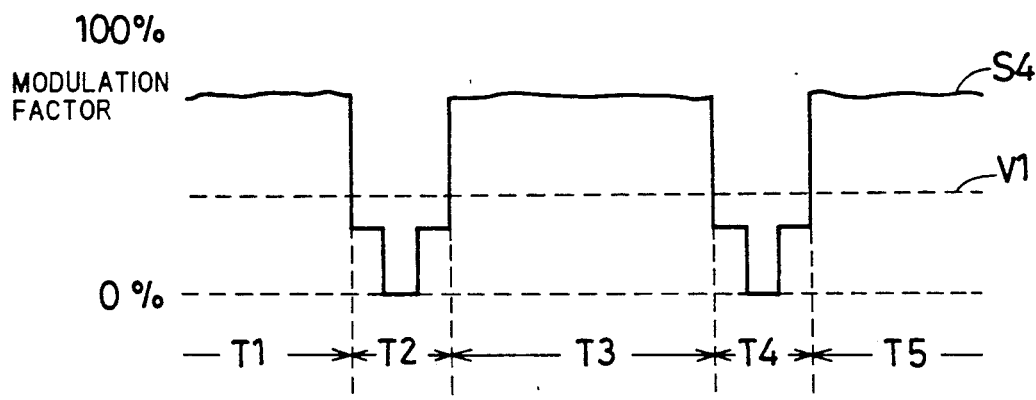
FIGS. 7A and 7B are explanatory diagrams showing modulation factors of video detection output.

In the differential pair formed by the transistors Q21 and Q22, the transistor Q21 is turned on and the transistor Q22 is turned off when the video detection output S4 is higher than the reference voltage V1, i.e., when the modulation factor of the video detection output S4 is deep as shown in periods T1, T3 and T5 in FIG. 7A. When the video detection output S4 is lower than the reference voltage V1, i.e., when the modulation factor of the video detection output S4 is shallow to the contrary, the transistor Q22 is turned on and the transistor Q21 is turned off.

In the differential pair formed by the transistors Q23 and Q24, the transistor Q23 is turned on and the transistor Q24 is turned off when the AGC output S2 is higher than the reference voltage V2, i.e., in such input of a weak electric field that the gain of the amplifier 1 is fixed at the maximum value and no AGC is applied. When the AGC output S2 is lower than the reference voltage V2 to the contrary, i.e., in input of an intermediate or strong electric field, the transistor Q24 is turned on and the transistor Q23 is turned off.

On the other hand, the common base/collector transistor Q25 is interposed between the resistor R6 and the power supply line IV, while the base of a pnp transistor Q26 is connected to the base of the transistor Q25 and the emitter of the transistor Q26 is connected to the power supply line IV with the emitter of the transistor Q25. The collector of the transistor Q26 is grounded through a resistor R7, as well as connected to the bases of npn transistors Q27 and Q30.

The transistor Q27 is differentially paired with an npn transistor Q28, and its collector is connected to the emitters of the transistors Q1 and Q2 while its emitter is connected to the emitter of the transistor Q28 and grounded through the constant current source I1. On the other hand, the transistor Q28 receives reference voltage V3 in its base, while its collector is connected to the power supply line IV. The transistor Q30 is differentially paired with an npn transistor Q29, while its collector is connected to the emitter of the transistor Q13 and its emitter is connected to the constant current source I2. On the other hand, the transistor Q29 receives reference voltage V3 in its base while its collector is connected to the base of the transistor Q13.

When the AGC output S2 is lower than the reference voltage V2 and the locking detection signal S10 is at a low level, i.e., when the electric field input is in an intermediate or strong state facilitating sampling of a VIF signal and the PLL circuit 3 is locked, sampling operation and holding operation by the phase detection circuit 8' and the LPF 9' are alternately performed in response to whether the video detection output S4 is higher or lower than the reference voltage V1.

In the periods T1, T3 and T5 shown in FIG. 7A when the video detection output S4 is higher than the reference voltage V1, holding operation is performed (the PLL circuit 3 enters a holding state). At this time, the transistors Q21 and Q24 are turned on and the transistors Q22, Q23 and Q15 are turned off. Consequently, the transistor Q25 is turned off since all current paths for the transistor Q25 are cut off, and hence the transistor Q26 is also turned off.

Thus, the transistors Q27 and Q30 are turned off since no current is supplied to the bases thereof, and the transistors Q28 and Q29 are turned on.

When the transistor Q27 is turned off, a double balanced type modulator formed by the transistors Q1 to Q6 performs no operation and hence no phase detection output S8' is developed and the capacitor C1 is not charged. Further, the charges in the capacitor C1 are not discharged since the transistor Q13 is turned off when the transistor Q29 is turned on. That is, output S9' of the LPF 9', which is the potential of a node N1, is held. Thus, output S6 of a VCO 6 is unchanged. That is, the PLL circuit 3 enters a holding state, and the output S6 of the VCO 6 obtained immediately before this holding state is maintained.

On the other hand, sampling operation is performed (the PLL circuit 3 enters a PLL state) in periods T2 and T4 shown in FIG. 7A when the video detection output S4 is lower than the reference voltage V1. At this time, the transistor Q22 is turned on so that collector current of the transistor Q25 flows through the transistor Q22, whereby the transistors Q25 and Q26 are turned on. Consequently, the transistors Q27 and Q30 are turned on and the transistors Q28 and Q29 are turned off. When the transistor Q27 is turned on, the double balanced type modulator formed by the transistors Q1 to Q6 operates so that the phase detection output S8' appears and the capacitor C1 is charged. The output S6 of the VCO 6 is changed in response to this. The sampling operation is performed in such a manner. At this time, the phase detection circuit 8' and the LPF 9' are absolutely equivalent to those of the conventional circuit shown in FIG. 4. That is, the PLL circuit 3 is in a PLL state and the output S6 of the VCO 6 is changed following the output S1 of the amplifier 1 similarly to the case of normal PLL operation.

When the AGC output S2 is lower than the reference voltage V2 or the locking detection signal is at a high level, i.e., in input of a weak electric field causing difficulty in sampling of the VIF signal or when the PLL circuit 3 is in an unlocked state, the following normal PLL operation is performed (the PLL circuit 3 enters a PLL state).

At this time, at least either the transistor Q23 or Q15 is turned on and hence a collector current path of the transistor Q25 is secured and the transistors Q25 and Q26 enter ON states. Consequently, the transistors Q27 and Q30 are turned on and the transistors Q28 and Q29 are turned off similarly to the case of the aforementioned sampling operation, whereby the phase detection circuit 8' and the LPF 9' are absolutely equivalent to those of the conventional circuit shown in FIG. 4. That is, the PLL circuit 3 enters a PLL state. Similarly to the conventional case, therefore, the phase detection circuit 8' derives the phase detection output S8' on the basis of phase difference between the output S1 of the amplifier 1 and the output S7 of the phase shifter 7, and the LPF 9 filters the phase detection ouptut S8' with a prescribed time constant to ouptut control voltage S9' for the VCO 6. Thus, the output S6 of the VCO 6 is changed following the ouptut S1 of the amplifier 1.

Thus, the operation of the phase detection circuit 8' and the LPF 9' is controlled on the basis of the three outputs S2, S4 and S10.

In the case of unlocking, the output S6 of the VCO 6 is not synchronized with the VIF signal, and hence sampling/holding operation by the phase detection circuit 8' and the LPF 9' is not performed but PLL operation is regularly performed since it is necessary to quickly attain synchronization.

In input of such a degree of a weak electric field that no AGC is applied, sampling of the VIF signal is difficult and hence no sampling/holding operation is performed by the phase detection circuit 8' and the LPF 9' but PLL operation is regularly performed also in this case.

However, when a locking state is entered and such a degree of an electric field that AGC is applied is inputted, sampling/holding operation is performed by the phase detection circuit 8' and the LPF 9' to solve the conventional problems (1) to (3). That is, the sampling operation is performed only at timing of a shallow modulation factor of the VIF signal, while holding operation is performed at other timing. Thus, no sampling operation is performed at timing of a deep modulation factor, whereby the problem (1) caused by overmodulation is prevented. Also in the case of phase distortion caused in the VIF signal pointed out as the problems (2) and (3), no sampling operation is performed at timing of a deep modulation factor of the VIF signal causing phase distortion, whereby the output S6 of the VCO 6 makes no following in response to the phase distortion of the VIF signal, to prevent the problems (2) and (3).

As hereinabove described, pull-in responsibility similar to that of the conventional case is obtained when the signal strength of the VIF signal is weak (in input of a weak electric field) or in unlocking in the PLL circuit 3 of this embodiment, while sample-and-hold operation is performed in response to the modulation factor of the VIF signal when a locking state is entered and such a degree of an electric field that AGC is applied (facilitating sampling of the VIF signal) is inputted, whereby the problems (1) to (3) can be solved to obtain correct video detection output.

Figure 6B:
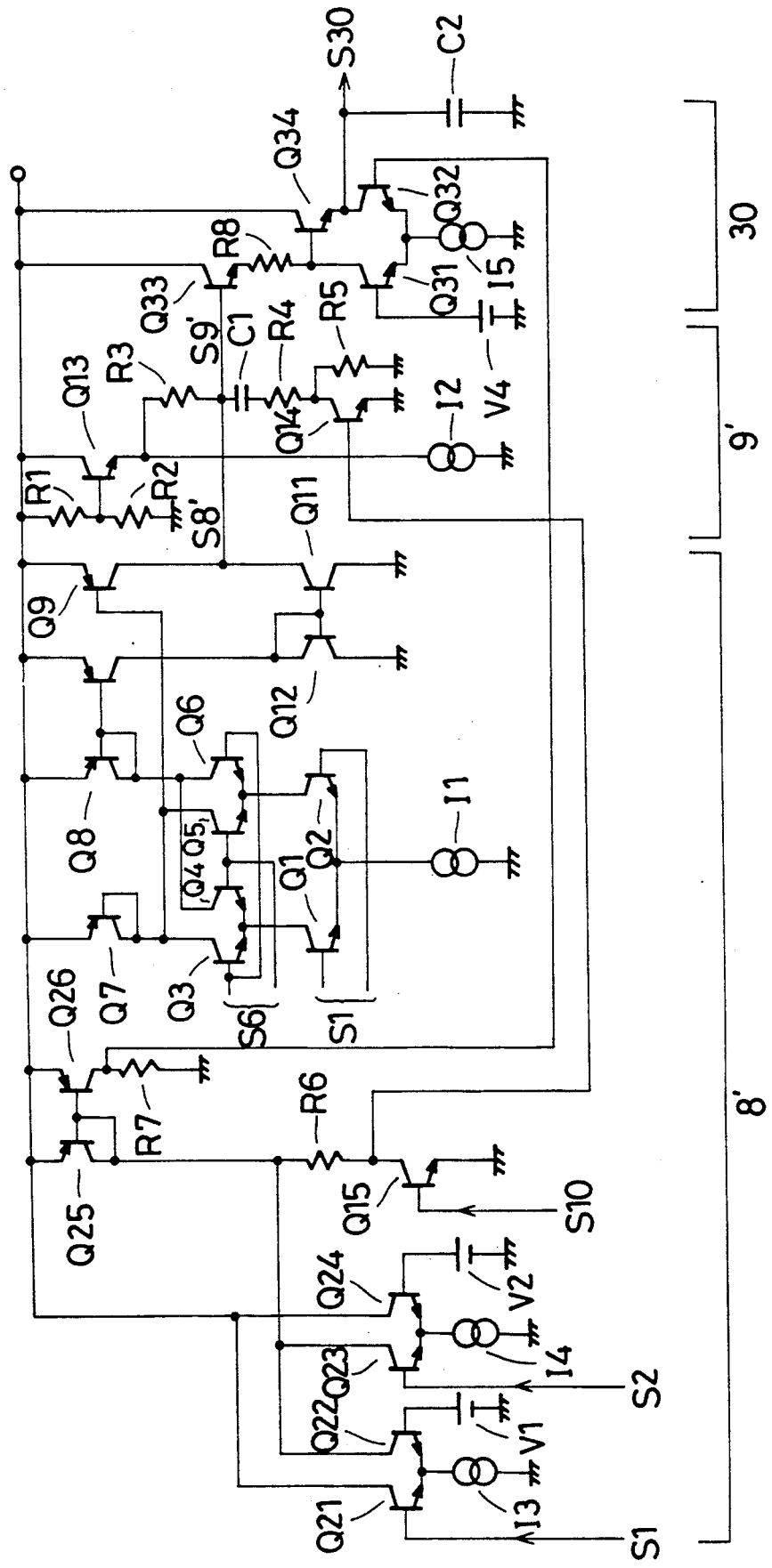

FIG. 6B is a circuit diagram showing a phase detection circuit 8' and an LPF 9' in a video detection circuit according to another embodiment of the present invention. As shown in the figure, the transistors Q27 to Q30 of the circuit shown in FIG. 6A are removed and a sample-hold circuit 30 is formed in an output side of the LPF 9' by npn transistors Q31 to Q34, reference voltage V4, a constant current source I5 and a capacitor C2. Output S9' of the LPF 9' is supplied to the base of the npn transistor Q33 of the sample-hold circuit 30, while the reference voltage V4 is supplied to the base of the transistor Q31 and the collector of a transistor Q26 is connected to the base of the transistor Q32. The transistors Q31 and Q32 are differentially paired with each other. A signal obtained at the junction between the emitter of the transistor Q34 and the collector of the transistor Q32 forms an output signal S30 of the sample-hold circuit 30, while a holding capacitor C2 is provided between the emitter of the trnasistor Q34 and the ground level.

In such structure, sampling operation is performed in the following manner when the transistor Q26 is in an ON state. That is, when the transistor Q26 is turned on, the transistor Q31 is turned off and the transistor Q32 is turned on. Consequently, the transistor Q34 is turned on to operate as an emitter follower, whereby voltage substantially equal to the output S9' of the LPF 9' is outputted as the output signal S30 of the sample-and-hold circuit 30. Simultaneously, charges responsive to the voltage of the output signal S30 are stored in the capacitor C2.

When the transistor Q26 is in an OFF state, on the other hand, holding operation is performed in the following manner: That is, when the transistor Q26 is turned off, the transistor Q31 is turned on and the transistor Q32 is turned off. Consequently, the transistor Q34 is turned off and hence the output signal S30 receives no influence by the output S9' of the LPF 9' and the voltage stored in the capacitor C3 is directly outputted as the output signal S30.

Thus, operation similar to that of the circuit shown in FIG. 6A can be performed when the sampling circuit 30 performs sampling operation and holding operation in response to ON and OFF of the transistor Q26 while regularly driving a double balanced type modulator formed by transistors Q1 to Q6. However, the circuit structure shown in FIG. 6A is more preferable since no additional capacitor C2 is required and it is not necessary to increase external terminals in the case of integration.

Figure 8A:
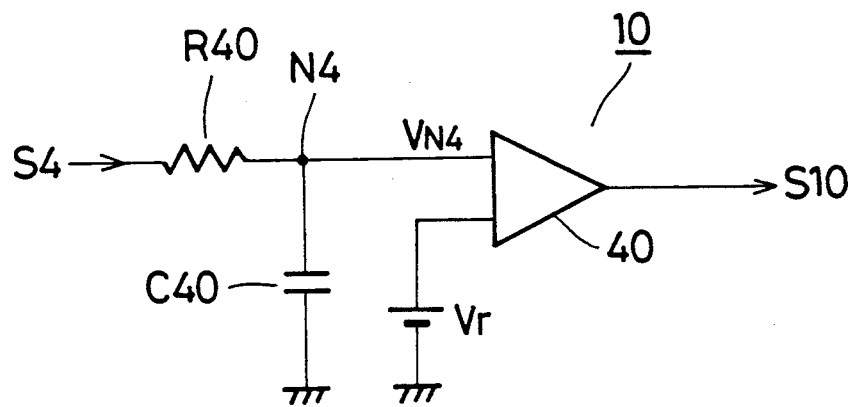
FIG. 8A is a circuit diagram showing another exemplary structure of a locking detection circuit shown in FIG. 5.
Figure 8B:
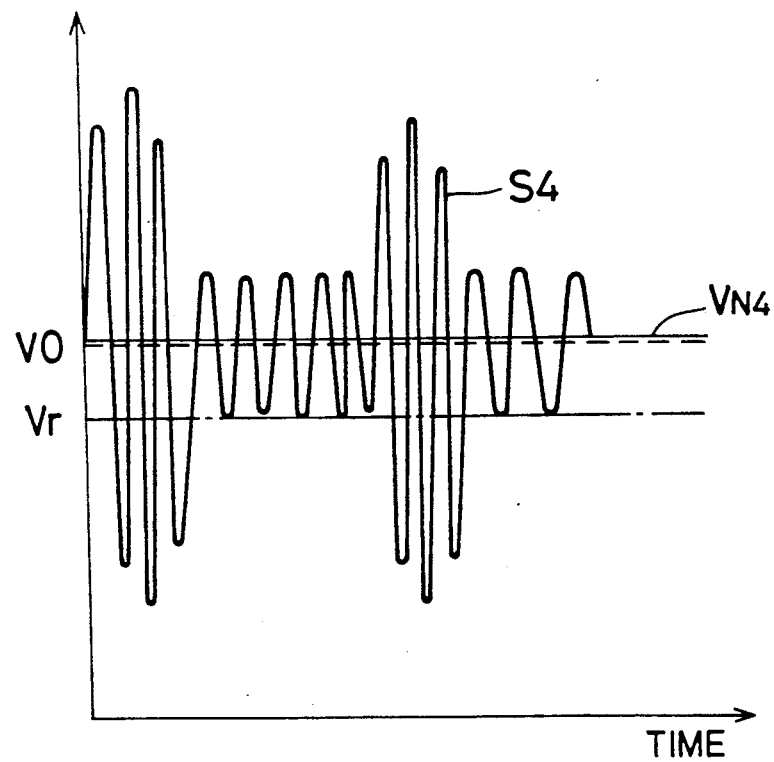
FIGS. 8B to 8D are graphs for illustrating the operation of the locking detection circuit shown in FIG. 8A.

FIG. 8A is a circuit diagram showing exemplary structure of a locking detection circuit 10. As shown in the figure, an integration circuit is formed by a resistor R4 and a capacitor C40, so that a signal obtained by integrating video detection output S4 appears in voltage $V_{N4}$ at a node N4. This voltage $V_{N4}$ is incorporated as one input of a comparator 40, while reference voltage $V_r$ is applied to another input of the comparator 40. Output of this comparator 40 serves as ouptut S10 of the locking detection circuit 10.

In such structure, detection by a synchronous detection circuit 4 is not correctly performed in unlocking, and hence the potential $V_{N4}$ at the node N4 is substantially equal to VO (silence potential). This potential $V_{N4}$ is higher than the reference voltage $V_r$ which is set to be lower than the silence potential VO, and hence the output S10 of the comparator 40 goes high so that a decision of unlocking is made.

Figure 8C:
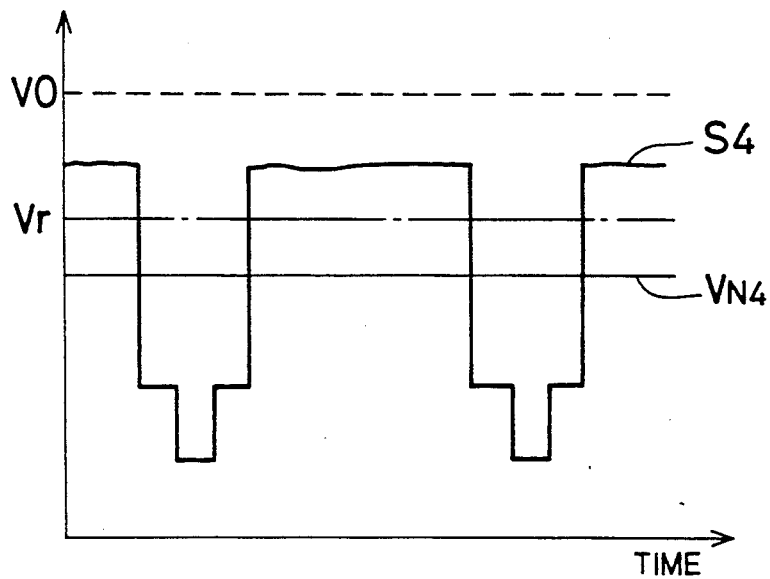

When an intermediate or strong electric field is inputted in locking, on the other hand, video detection output S4 is changed at a level below the silence potential VO and the potential $V_{N4}$ at the node N4 is lower than the reference voltage $V_r$ as shown in FIG. 8C, whereby the output S10 of the comparator 40 goes to a low level and a decision is made on a locking state.

Figure 8D:
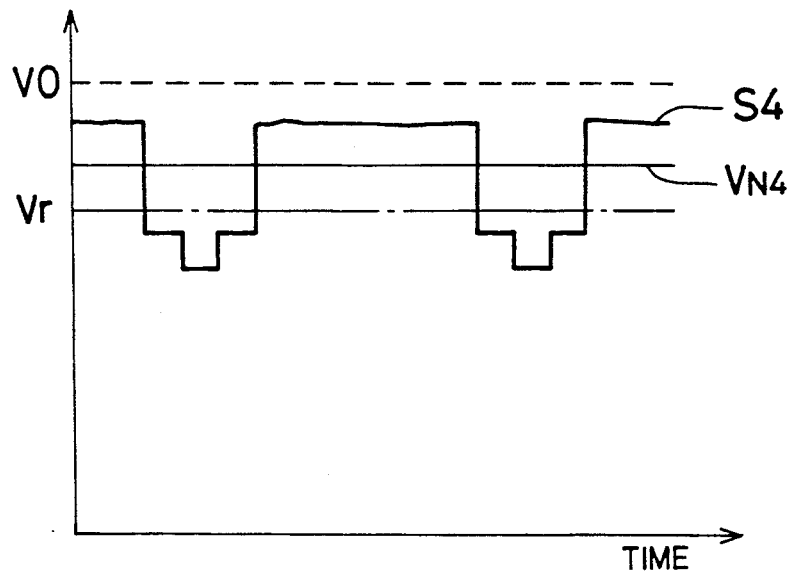

Even if the video detection output S4 is changed at a level below the silence potential VO as shown in FIG. 8D, the potential $V_{N4}$ at the node N4 exceeds the reference voltage $V_r$ when a weak electric field is inputted in locking, whereby the output S10 of the comparator 40 goes to a high level and the same decision output as that in an unlocking state is obtained.

The locking detection circuit 10 is structured in the aforementioned manner, so that a decision of unlocking can be made in locking when a weak electric field is inputted. When this locking detection circuit 10 is employed, therefore, an effect similar to that of the video detection circuit shown in FIG. 5 can be attained without inputting the AGC output S2 in the phase detection circuit 8' in the block diagram shown in FIG. 5, i.e., without providing the transistors Q23 and Q24, the constant current source 14 and the reference voltage V2 shown in FIGS. 6A and 6B.

Figure 7B:
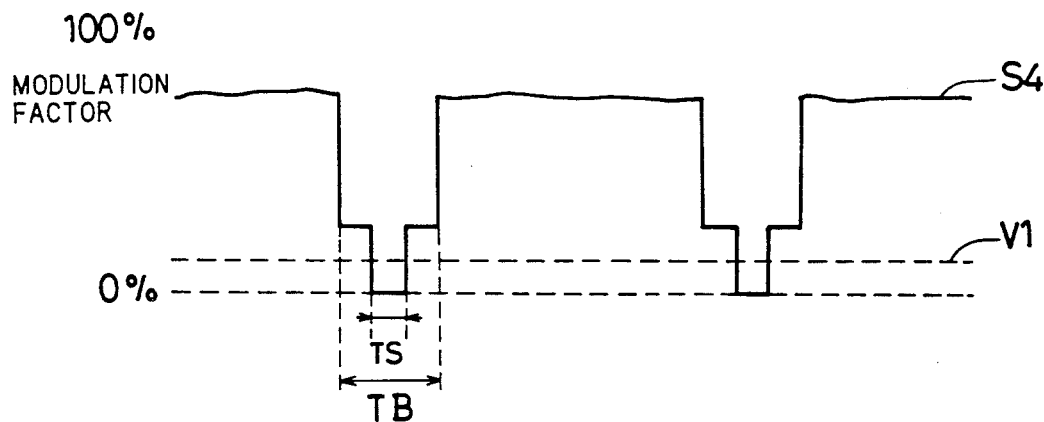

In the aforementioned embodiment, the reference voltage V1 is set at the level shown in FIG. 7A. Therefore, the PLL circuit 3 performs sampling operation during a blanking period TB (see FIG. 7B) including those around a synchronizing signal. However, the PLL circuit 3 can perform sampling operation only at timing of a shallower modulation factor of the VIF signal as the modulation factor of the reference voltage V1 approaches 0%. Therefore, the reference voltage V1 may be set at the level shown in FIG. 7B so that the PLL circuit 3 performs sampling operation in association with the timing of a synchronous period TS of the synchronizing signal of the video signal.

Although the PLL detection circuit processing both of sound and video signal components is shown in this embodiment, the present invention is also applicable to a video-dedicated or sound-dedicated detection circuit of the PLL system. Namely, in the case of a video-dedicated circuit, correct video detection output can be obtained even if an overmodulated VIF signal is inputted. In the case of a sound-dedicated circuit, on the other hand, a video carrier signal is not subjected to phase modulation by an AM component of a VIF signal since a bandpass filter for the VIF signal has no inclined characteristic, while a sound intermediate frequency signal having a smaller sound buzz can be obtained even when a video carrier of a broadcasting signal is subjected to phase modulation due to nonlinearity in amplification characteristic of a high power amplifier on a transmitter side.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A video intermediate frequency signal circuit, comprising:
   input means for inputting a video intermediate frequency signal;
   a PLL circuit connected to said input means and including a phase detection circuit, a low-pass filter and a voltage controlled oscillator to form a phase lock loop (PLL), for outputting a PLL output signal being synchronous with said video intermediate frequency signal in locking;
   a synchronous deteciton circuit connected to said input means and said PLL circuit for synchronously detecting said video intermediate frequency signal on the basis of said PLL output signal to derive video detection output;
   PLL locking detection means connected to said synchronous detection circuit for detecting locked and unlocked states of said PLL circuit on the basis of said video detection output to output a locking detection signal indicating whether said PLL circuit is in said locked state or said unlocked state;

signal strength detection means connected to said synchronous detection circuit for detecting signal strength of said video intermediate frequency signal on the basis of said video detection output to output a signal strength detection signal indicating whether or not said video intermediate frequency signal corresponds to a weak electric field; and modulation factor detection means connected to said synchronous detection circuit for detecting a modulation factor of every moment of said video intermediate frequency signal to output a modulation factor detection signal indicating whether or not said modulation factor of said video intermediate frequency signal is less than a prescribed value, said PLL circuit receiving said locking detection signal, said signal strength detection signal and said modulation factor detection signal to be switched between a PLL state and a holding state in response to these signals for deriving from said phase detection circuit a signal responsive to phase difference between said video intermediate frequency signal and an oscillation output signal from said voltage controlled oscillator to supply the same to said voltage controlled oscillator through said low-pass filter to thereby output said PLL output signal in said PLL state while maintaining said oscillation output signal of said voltage controlled oscillator in said PLL state immediately before said holding state to thereby output said PLL output signal in said holding state.

2. A video intermediate frequency signal processing circuit in accordance with claim 1, wherein
said PLL circuit further includes a phase shifter for shifting in phase said oscillation output signal from said voltage control oscillator to supply the same to an input of said phase detection circuit.

3. A video intermediate frequency signal processing circuit in accordance with claim 2, wherein
said input means includes an amplifier for amplifying said video intermediate frequency signal to output the same to said PLL circuit,
said signal strength detection circuit including an automatic gain control circuit for controlling an amplification factor of said amplifier to regularly maintain said video detection output in a constant amplitude.

4. A video intermediate frequency signal processing circuit in accordance with claim 3, wherein.

said modulation factor detection means is incorporated in said phase detection circuit of said PLL circuit,
said PLL circuit being switched between said PLL state and said holding state in response to said locking detection signal, said signal strength detection signal and said video detection output.

5. A video intermediate frequency signal processing circuit in accordance with claim 4, wherein
said low-pass filter includes a capacitor for filtering, said capacitor being utilized for sampling/holding output of said phase detection circuit.

6. A video intermediate frequency signal processing circuit in accordance with claim 4, wherein
said PLL circuit further includes a sample-hold circuit for sampling/holding output of said phase detection circuit at an output side of said low-pass filter.

7. A video intermediate frequency signal processing circuit in accordance with claim 5, wherein
said prescribed value in said modulation factor detection mean is set at a value for discriminating a blanking period of said video intermediate frequency signal.

8. A video intermediate frequency signal processing circuit in accordance with claim 5, wherein
said prescribed value in said modulation factor detection mean is set at a value for discriminating a synchronous period of said video intermediate frequency signal.

9. A video intermediate frequency signal processing circuit in accordance with claim 3, wherein
said PLL locking detection means comprises:
an integration circuit for integrating said video detection output, and
a comparator having a first input for receiving output of said integration circuit, a second input for receiving a predetermined reference signal and an output for outputting said locking detection circuit.

10. A video intermediate frequency signal processing circuit in accordance with claim 9, wherein
said PLL locking detection means also serves as said signal strength detection means,
said modulation factor detection means being incorporated in said phase detection circuit of said PLL circuit,
said PLL circuit being switched between said PLL state and said holding state in response to said locking detection signal and said video detection output.

* * * * *